(12) United States Patent
Glazunov

(10) Patent No.: US 9,755,138 B2
(45) Date of Patent: Sep. 5, 2017

(54) METHOD FOR PRODUCING AN ELECTRONIC COMPONENT

(71) Applicant: EPCOS AG, Munich (DE)

(72) Inventor: Alexander Glazunov, Deutschlandsberg (AT)

(73) Assignee: EPCOS AG, Munich (DE)

( * ) Notice: Subject to any disclaimer, the term of this patent is extended or adjusted under 35 U.S.C. 154(b) by 135 days.

(21) Appl. No.: 14/646,463

(22) PCT Filed: Nov. 25, 2013

(86) PCT No.: PCT/EP2013/074599
§ 371 (c)(1),
(2) Date: May 21, 2015

(87) PCT Pub. No.: WO2014/086611
PCT Pub. Date: Jun. 12, 2014

(65) Prior Publication Data
US 2015/0318464 A1    Nov. 5, 2015

(30) Foreign Application Priority Data

Dec. 7, 2012 (DE) .................. 10 2012 111 972

(51) Int. Cl.
*H01L 41/04* (2006.01)
*H01L 41/22* (2013.01)
(Continued)

(52) U.S. Cl.
CPC .......... *H01L 41/257* (2013.01); *H01L 41/042* (2013.01); *H01L 41/29* (2013.01); *Y10T 29/43* (2015.01)

(58) Field of Classification Search
CPC ..... H01L 41/257; H01L 41/042; H01L 41/29; H05B 41/7822
(Continued)

(56) References Cited

U.S. PATENT DOCUMENTS 5,766,340 A * 6/1998 Geosling ................. C30B 33/00
117/2
6,356,008 B1 * 3/2002 Nakajima ............. H01L 41/083
29/25.35
(Continued)

FOREIGN PATENT DOCUMENTS

DE    2235055 A1    1/1974
DE    10225704 A1    1/2003
(Continued)

OTHER PUBLICATIONS

Wikipedia, "Piezoelektrizität (Piezoelectricity)," http://de.wikipedia.org/w/index.php?title=Piezoelektrizit%E4t&oldid=122365079, Sep. 9, 2013, 8 pages.

*Primary Examiner* — Thomas Dougherty
(74) *Attorney, Agent, or Firm* — Slater Matsil, LLP

(57) ABSTRACT

A method for producing an electronic component includes providing a piezoelectric main body, which is provided with electrodes. A first electric polarization field having a first polarity direction is applied to the piezoelectric main body between the two electrodes and then a second electric polarization field is applied in a second polarity direction, opposite to the first polarity direction, to the piezoelectric main body between the electrodes. The absolute value of the second electric polarization field differs from that of the first electric polarization field.

16 Claims, 3 Drawing Sheets

(51) Int. Cl.
*H01L 41/257* (2013.01)
*H01L 41/29* (2013.01)

(58) Field of Classification Search
USPC .......... 310/311–371; 264/435, 436; 29/25.35
See application file for complete search history.

(56) References Cited

U.S. PATENT DOCUMENTS

| | | |
|---|---|---|
| 6,664,715 B2 | 12/2003 | Yamamoto et al. |
| 7,353,585 B2 * | 4/2008 | Goat .................... H01L 41/257 156/89.11 |
| 2003/0062912 A1 * | 4/2003 | Nakajima ............. H01L 41/257 324/727 |
| 2008/0030102 A1 | 2/2008 | Ohnishi et al. |
| 2008/0239016 A1 * | 10/2008 | Miura ................. B41J 2/14233 347/68 |
| 2008/0265715 A1 * | 10/2008 | Dollgast ............ F02M 51/0603 310/328 |
| 2013/0222453 A1 * | 8/2013 | Darling ................ B41J 2/04513 347/10 |
| 2013/0334933 A1 * | 12/2013 | Ukai ..................... F04B 43/046 310/366 |
| 2015/0194591 A1 * | 7/2015 | Fujii ................... H01L 41/1876 318/116 |

FOREIGN PATENT DOCUMENTS

| | | |
|---|---|---|
| DE | 102004024122 A1 | 12/2005 |
| GB | 1432879 A | 4/1976 |
| JP | H0548173 A | 2/1993 |
| JP | H06224486 A | 8/1994 |
| JP | 2007059525 A | 3/2007 |
| JP | 2008053285 A | 3/2008 |
| WO | 2009028348 A1 | 3/2009 |
| WO | 2009047048 A1 | 4/2009 |

* cited by examiner

Fig. 1
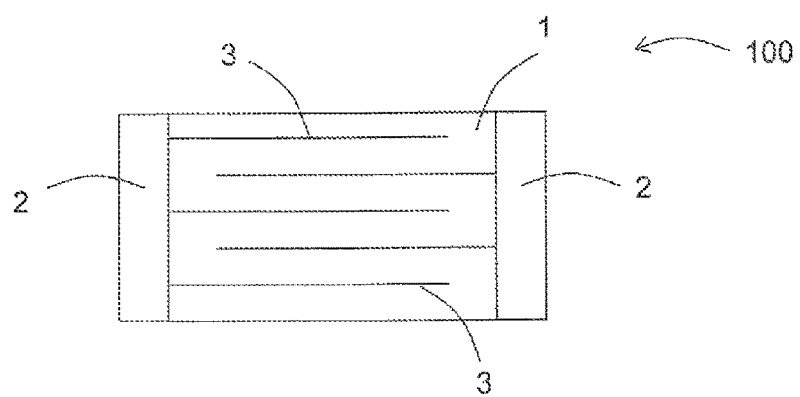
Fig. 2
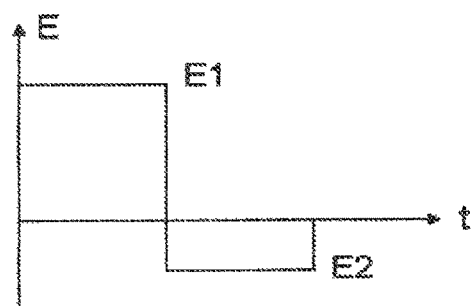
Fig. 3a
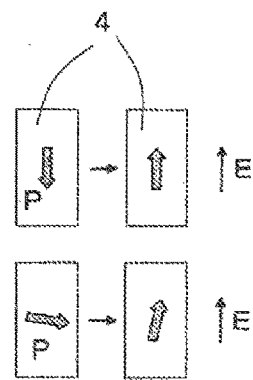
Fig. 3b

METHOD FOR PRODUCING AN ELECTRONIC COMPONENT

This patent application is a national phase filing under section 371 of PCT/EP2013/074599, filed Nov. 25, 2013, which claims the priority of German patent application 10 2012 111 972.4, filed Dec. 7, 2012, each of which is incorporated herein by reference in its entirety.

TECHNICAL FIELD

The present invention relates to a method for producing an electronic component.

SUMMARY

A proposed method comprises providing a piezoelectric main body, which is provided with electrodes, and applying a first electric polarization field having a first polarity direction to the piezoelectric main body between the electrodes. Furthermore, the proposed method comprises, after applying the first polarization field, applying a second electric polarization field in a second polarity direction to the piezoelectric main body between the electrodes. The first polarity direction is polarized oppositely to the second polarity direction, wherein the absolute value of the second electric polarization field differs from that of the first electric polarization field. Furthermore, the method comprises completing the electronic component.

The piezoelectric main body is preferably electrically conductively connected to the electrodes. Preferably, the piezoelectric main body comprises two electrodes, for example, in each case one electrode at two opposite sides of the piezoelectric main body. Preferably, the electrodes are external electrodes. Advantageously, an electric operating field can be applied to the piezoelectric main body via the electrodes. The electric operating field is taken to mean that electric field which forms when an electric operating voltage is applied during operation between the electrodes. During operation, the electric operating field can likewise be present between internal electrode layers of the electronic component, which are in each case connected to one of the external electrodes.

The method described can be used to produce a, preferably piezoelectric, electronic component which advantageously has a very large deflection during operation. The deflection of such a piezoelectric main body during the operation of the electronic component is substantially determined by a contribution of the piezoelectric effect, i.e. the deformation of the crystal lattice when an electric field is applied, on the one hand, and, on the other hand, by a contribution of the flipping of ferroelectric domains in the piezoelectric main body when the electric operating field is applied. The piezoelectric main body can be or contain a piezoelectric ceramic. Each individual grain of the piezoelectric ceramic can have one or a plurality of ferroelectric domains having in each case a uniform dielectric polarization.

Flipping of a ferroelectric domain is understood to mean the change in the polarization direction of the ferroelectric domain when an electric operating field is applied. Furthermore, a distinction is made between two types of domain flipping, namely domain flipping by 180° and domain flipping by "non 180°". Domain flipping by 180° means a change in the polarization direction of the respective ferroelectric domain by 180° when an electric field is applied. Domain flipping by "non 180°" means a change in the polarization direction of the respective ferroelectric domain by an angle different than 180° when the electric operating field is applied.

The domain flipping by "non 180°" contributes more than 80% to the total deflection at room temperature at least in piezoelectric ceramics based on lead zirconium titanate (PZT).

Accordingly, the deflection of a piezoelectric ceramic can be improved by the domain flipping by "non 180°" preferably being promoted. The domain flipping by "non 180°" is influenced, for example, by the material composition of the piezoelectric ceramic, the Curie point of the piezoelectric ceramic, the polarity state or the grain size of the piezoelectric ceramic. Furthermore, domain flipping by "non 180°" can be promoted by the application of a mechanical force or counterforce, in particular during the polarization, to the piezoelectric main body.

The present production method advantageously makes it possible to obtain a polarization state of the piezoelectric main body in which the contribution of the domain flipping of ferroelectric domains by "non 180°" when an electric operating field is applied during operation between the electrodes is significantly increased since, as a result of the application of the first and second electric polarization fields, which are preferably aligned antiparallel and have different contributions, the domain flipping by "non 180°" can be promoted. Accordingly, it is possible to produce an electronic component which, in comparison with a component from the prior art, has a greater deflection during operation or can be produced more simply with a comparable deflection.

As a result of the proposed application of the first and second electric polarization fields, the piezoelectric main body can furthermore advantageously be polarized in such a way that it is possible to dispense with applying a mechanical force during the polarization, without a reduction of the deflection that is achievable during operation. This is advantageous in particular since a mechanical device for applying the mechanical force described places stringent demands on the precision of the mechanical component parts involved and is therefore very cost-intensive.

Advantageously, accordingly, only an electric voltage generator is required for the described production method or the polarization of the piezoelectric main body.

In one preferred configuration of the method, the first and second electric polarization fields are chosen in such a way that the achievable deflection of the electronic component during operation is increased by up to 75% compared to an electronic component which was polarized in accordance with a production or polarization method from the prior art and/or without the application of a mechanical force.

Before the first electric polarization field is applied, the piezoelectric main body is preferably unpolarized. By way of example, the piezoelectric main body in this case can be in a state directly after sintering. In this regard, the piezoelectric main body can have no or approximately no spontaneous dielectric polarization.

The application of an electric field, e.g. of an electric polarization field, can alter the domain structure of the ferroelectric domains. The polarization of a ferroelectric domain then aligns along the applied electrical field, the domain flipping by "non 180°" predominantly taking place. After the electric field has been switched off, the piezoelectric ceramic is polarized, that is to say that a spontaneous dielectric polarization exists. Not all of the ferroelectric domains can flip back to their original position after the electric field has been switched off, because the distribution of electric charges and elastic stresses has changed as a result of the polarization.

In one preferred configuration of the method, relative to a predefined electric operating field of the electronic component which is applied for operation between the electrodes, the first polarity direction is positive and the second polarity direction is negative. The deflection of a piezoelectric component is usually proportional to the electric field strength applied to the component. As a result of this configuration, the electric field direction or a polarity of the electric operating field of the electronic component, for which electric operating field said electronic component is intended to be operated and for which electric operating field the electronic component is intended to have an increased deflection, is advantageously predefined with regard to the connection or the allocation of the electrodes. The first electric polarization field can be aligned parallel to the electric operating field. The second electric polarization field can be aligned antiparallel to the electric operating field.

In one preferred configuration of the method, the absolute value of the first electric polarization field is less than 4 kV/mm.

In one preferred configuration of the method, the absolute value of the first electric polarization field is greater than 1 kV/mm.

In one preferred configuration of the method, the absolute value of the first electric polarization field is between 1 and 4 kV/mm.

These configurations advantageously make it possible, during the operation of the electronic component, to prevent an electric flashover and nevertheless to obtain the largest possible deflection of the electronic component.

In one preferred configuration of the method, the absolute value of the first electric polarization field is greater than the absolute value of the second electric polarization field.

In one preferred configuration of the method, at the end of the polarization process with the first electric polarization field the deflection of the piezoelectric main body as a function of the applied electric field follows a hysteresis curve which determines an electric coercive field strength, and where the absolute value of the second electric polarization field is chosen to be less than the absolute value of the electric coercive field strength. The electric coercive field strength here preferably relates to that electric field strength for which a deflection of the piezoelectric main body polarized with the first electric polarization field but not yet with the second electric polarization field is equal to zero. This configuration advantageously makes it possible to obtain a large deflection in the positive direction of the electronic component if the electric field during operation or the electric operating voltage is applied in the positive direction. This is explained in greater detail in one exemplary embodiment with reference to the hysteresis curve (so-called "butterfly curve").

In one preferred configuration of the method, the first and/or the second electric polarization field have/has a temporal field profile having one or a plurality of electric field pulses. This pulsation of the electric polarization fields during the polarization gives rise to Joule heat as a result of the charge movement, which can advantageously improve the effect of the polarization by up to 20% compared to a static or non-pulsed polarization. The absolute value of an electric polarization field can be the absolute value of the maximum of a field pulse.

In one preferred configuration of the method, the field pulses of the first and/or of the second electric polarization field have in each case at least one of the pulse shapes rectangular, triangular, trapezoidal and sinusoidal shape.

In one preferred configuration of the method, the piezoelectric main body has a plurality of piezoelectric layers and is provided with a plurality of internal electrode layers, wherein the electrodes form external electrodes arranged outside the piezoelectric main body, and wherein each internal electrode layer is electrically conductively connected to one of the external electrodes. The plurality of piezoelectric layers and internal electrode layers advantageously makes it possible to obtain, inter alia, an increased deflection of the electronic component since the electric field strength present at an individual piezoelectric layer, said electric field strength generally being proportional to the deflection of a piezoelectric layer, can be significantly increased in this way.

In one preferred configuration of the method, the piezoelectric main body comprises a ceramic, for example, containing lead zirconium titanate.

The present application furthermore comprises an operating method for an electronic component which was produced according to the method described above. The operating method comprises applying a mechanical force to the electronic component. As a result of this configuration, the advantage of an increased deflection of the electronic component during operation can be utilized or the deflection can advantageously be increased further. The reason is that applying the mechanical force advantageously makes it possible to at least partly maintain the polarization state striven for by the production method for the operation of the electronic component, since a mechanical force on the piezoelectric main body can counteract a depolarization of the piezoelectric main body. For this purpose, before the mechanical force is applied, the electronic component can be incorporated into a device for the use of the electronic component. Said device can be, for example, a valve, in particular an injection valve of a motor vehicle engine.

In one preferred configuration of the operating method, applying the mechanical force to the electronic component is followed by applying an electric operating field between the electrodes to the electronic component, wherein the electric operating field is polarized in accordance with the first polarity direction. This configuration advantageously makes it possible to utilize a large deflection during the operation of the electronic component.

An electronic component which was produced according to the method described above is furthermore specified in the context of the present invention.

In the case of the electronic component, the number of ferroelectric domains whose polarization direction changes by an angle different than 180° when an electric operating field is applied is advantageously increased compared to an electronic component from the prior art which was polarized in the usual way and/or without application of a mechanical force.

In particular, all features disclosed for the method are also disclosed for the electronic component and/or the operating method, and vice-versa.

BRIEF DESCRIPTION OF THE DRAWINGS

Further advantages, advantageous configurations and expediencies of the invention will become apparent from the following description of the exemplary embodiments in association with the figures.

FIG. 1 indicates first method steps of the method described on the basis of a schematic side view or shows an electronic component produced by the method described.

FIG. 2 shows a simplified temporal field profile comprising a first and a second electric polarization field.

FIG. 3 shows a schematic view of ferroelectric domains. Domain flipping by 180° is indicated in FIG. 3a and domain flipping by "non 180°" is indicated in FIG. 3b.

Figure 4A:
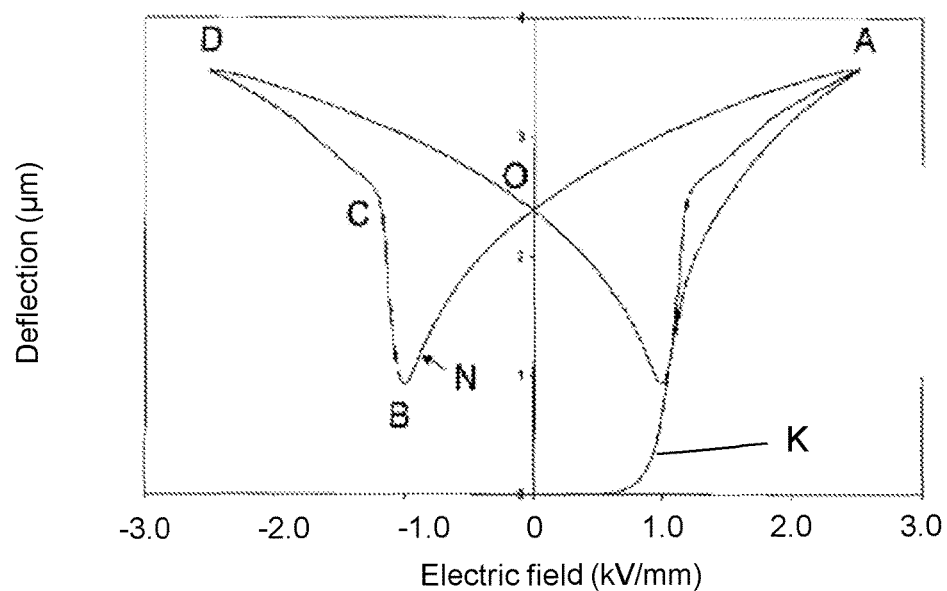
FIG. 4 shows a hysteresis curve (butterfly curve) of a polarized piezoelectric ceramic.

Elements that are identical, of identical type and act identically are provided with identical reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

FIG. 1 shows the provision of a piezoelectric main body 1. The piezoelectric main body 1 is provided with two external electrodes 2 and internal electrode layers 3. The two external electrodes 2 are preferably mechanically linked to the piezoelectric main body 1 or mechanically connected thereto at opposite sides of the piezoelectric main body 1. The piezoelectric main body preferably comprises a piezoelectric ceramic, for example, composed of lead zirconium titanate (PZT) or barium titanate. The internal electrode layers 3 can comprise, for example, the materials silver, palladium, copper, platinum and/or alloys or combinations of these materials.

FIG. 2 shows a schematic illustration of the temporal sequence of electric polarization fields. In the context of a production or polarization method, chronologically first a first electric polarization field E1 and then a second electric polarization field E2 are applied to the piezoelectric main body 1 between the electrodes 2 (see, e.g, FIG. 1). The first and second electric polarization fields E1 and E2, as long as they are present in each case between the electrodes 2, are in each case constant or represented as a rectangular pulse. The first electric polarization field E1 is positive and the second electric polarization field E2 is negative. Furthermore, the absolute value of the first electric polarization field E1 is greater than the absolute value of the second electric polarization field E2. The absolute value of the first electric polarization field E1 is preferably between 1 and 4 kV/mm. At even higher electric field strengths, there is the risk of an electric flashover particularly during the production of electronic components having a plurality of piezoelectric layers. At lower electric field strengths, on the other hand, the piezoelectric main body 1 would be polarized only insufficiently. Expediently, a corresponding electronic component is likewise operated with an electric operating field that is less than the first electric polarization field, that is to say, for example, less than 4 kV/mm.

Ferroelectric domains arise in a piezoelectric ceramic, for example, during cooling from the sintering temperature to below the Curie point. After cooling, the ferroelectric domains are oriented randomly in the piezoelectric ceramic, such that the total polarization is low or equal to zero.

FIG. 3 shows a schematic illustration of the domain flipping of ferroelectric domains by 180° (FIG. 3a) and by "non 180°" (FIG. 3b). In the polarization by the first and second polarization fields that can be carried out in accordance with the production method, it is preferably possible to obtain a polarization state of the piezoelectric main body 1 in which the domain flipping by "non 180°" can be promoted in order to obtain the highest possible deflection during the operation of the electronic component 100. In FIG. 3, the rectangles represent ferroelectric domains 4, the polarization direction P of which is indicated on the left by the arrow respectively depicted in the ferroelectric domains 4. The direction of an applied electric field E is represented by the arrows shown on the right outside the ferroelectric domains 4. The arrows shown in each case between the upper and lower ferroelectric domains 4 indicate a change in the polarization P that is brought about by the electric field E. FIG. 3a illustrates domain flipping by 180°, wherein the polarization directions of the upper ferroelectric domains are directed exactly oppositely to one another. FIG. 3b illustrates domain flipping by "non 180°", wherein the polarization directions of the lower ferroelectric domains differ by an angle different than 180°.

Figure 4B:
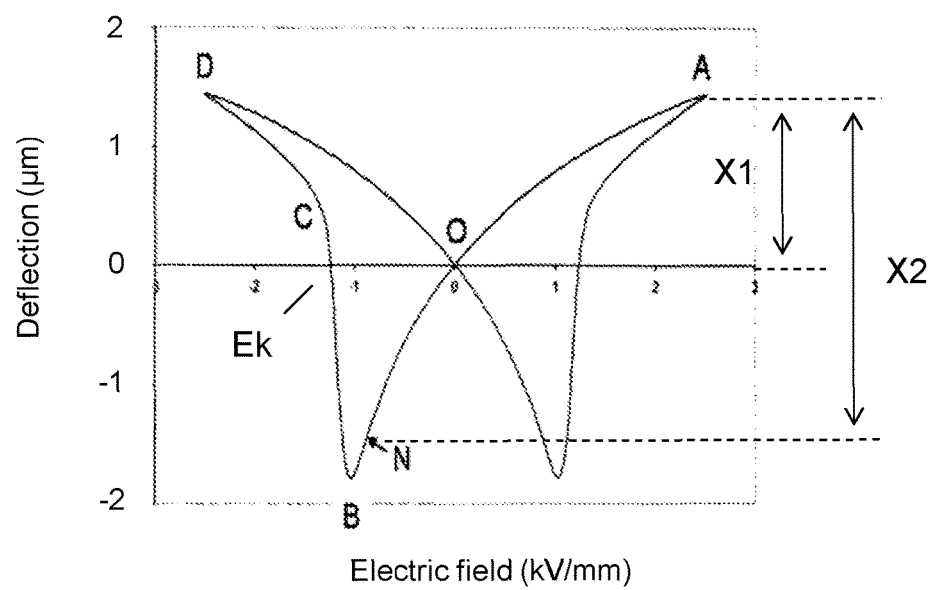

FIG. 4a shows a hysteresis curve of a piezoelectric ceramic or of the piezoelectric main body 1. The curve K originating at the coordinate origin indicates an initial curve of the piezoelectric main body 1 from which the illustrated hysteresis curve results after the polarization by the first electric polarization field E1. FIG. 4b shows a hysteresis curve, the origin O of which has been shifted to the origin of the coordinate system for the sake of improved clarity. The hysteresis curve describes the hysteresis of the deflection (in μm) of the piezoelectric main body 1 as a function of an applied external electric field (in kV/mm) after the conclusion of the polarization process with the first electric polarization field E1. In this case, the hysteresis of the deflection of the piezoelectric main body 1 has an electric coercive field strength Ek.

A customary starting state of the polarization or polarization state, for example, that of an electronic component from the prior art which was polarized in a usual way and without the application of a mechanical counterforce, corresponds to the point O (origin) in FIG. 4b. Accordingly, the maximum achievable deflection under a positive electric polarization field is X1. The electric coercive field strength Ek corresponds to that electric field strength at which outside the origin the deflection is equal to zero. The electric coercive field strength corresponds approximately to 1.2 to 1.3 kV/mm, that is to say corresponds for instance approximately to the electric field strength at the point B. Domain flipping by 180° takes place here, for example, between the points B and C. By contrast, the deflection between the points O and B, and C and D comprises contributions from the actual piezoelectric effect, which in other words is not caused by domain flipping, and from domain flipping by "non 180°".

By means of the production method, in particular by means of the second polarization field E2 aligned antiparallel to the first polarization field E1, the starting state of the polarization can then preferably be shifted from the point O to the point N. The nearer the starting state is to the point B, the greater the achievable deflection of the electronic component 100 becomes if a positive electric operating field is applied during operation. Correspondingly, the maximum achievable deflection for an electronic component according to this invention is X2 or approximately X2. In this regard, the achievable deflection of the electronic component 100 during operation can be increased by up to 75% compared to an electronic component which was polarized in accordance with a production or polarization method from the prior art and/or without the application of a mechanical force.

An increase in the deflection of piezoelectric ceramics can also be achieved by an alteration of the ceramic formulation by targeted addition of dopants or a reduction of the Curie point of the piezoelectric ceramic, which is likewise achievable by an alteration of the ceramic formulation. Further possibilities include promoting grain growth in the piezoelectric ceramic, likewise by influencing the ceramic formulation or ceramic composition or the corresponding sintering process. It is likewise possible to increase the deflection of piezoelectric ceramics by polarizing the piezoelectric ceramic under a strong mechanical force or counterforce, particularly at elevated temperatures. The proposed method can additionally increase the maximum deflection which is possible with the measures mentioned.

In the context of the present application, provision is likewise made for the first electric polarization field to be negative and the second electric polarization field to be positive. This configuration is expedient particularly in the case of a negative electric operating field. The embodiments described are then analogously applicable provided that a symmetrical butterfly curve is present.

Figure 5:
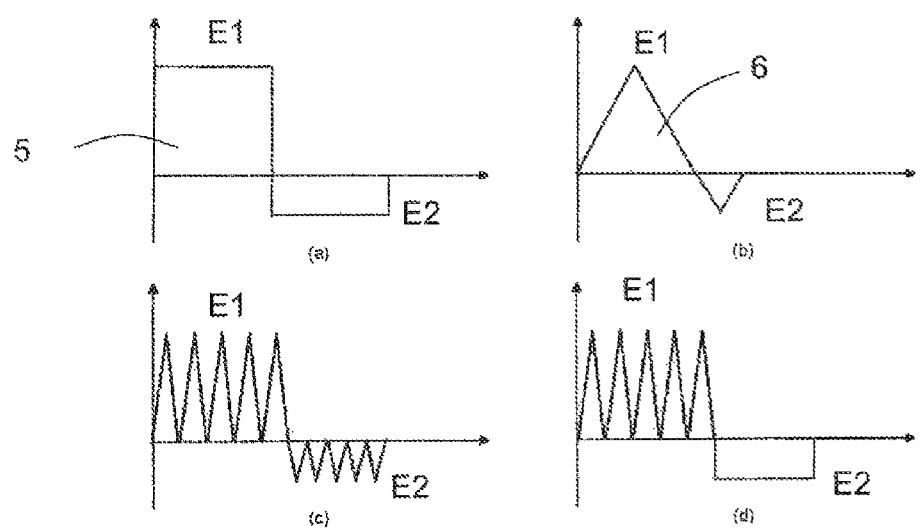
FIG. 5 shows in a simplified manner alternative configurations of temporal field profiles of electric polarization fields, in each case comprising a first and a second electric polarization field.

FIG. 5 shows in a simplified manner alternative configurations of temporal sequences of the first and second electric polarization fields E1 and E2. FIG. 5a shows a field profile of the first and second electric polarization fields E1 and E2 in accordance with FIG. 2. The first and second electric polarization fields E1 and E2 are formed in each case by an individual rectangular pulse 5.

FIG. 5b shows a first and a second electric polarization field E1 and E2 formed in each case by an individual triangular pulse 6. In this case, as in FIGS. 2 and 5a, the second electric polarization field E2 was applied after the first electric polarization field E1 and, furthermore, the absolute value of the first electric polarization field E1 is greater than the absolute value of the second electric polarization field E2. Moreover, the first electric polarization field E1 is positive and the second electric polarization field E2 is negative.

The ratio of the duration for which the first electric polarization field E1 is applied to the duration for which the second electric polarization field E2 is applied can be between 10:1 and 1:10. Said ratio is preferably between 2:1 and 1:2.

FIG. 5c shows in each case a temporal sequence of the first electric polarization field E1 and of the second electric polarization field E2, in which, in contrast to the illustration from FIG. 5b, both electric polarization fields E1 and E2 and the profiles thereof comprise a plurality of triangular pulses. In other words, both electric polarization fields E1 and E2 are in each case pulsed, such that the piezoelectric main body 1 is polarized in each case temporally variably when the first and second electric polarization fields E1 and E2 are applied.

In FIG. 5d, in contrast to FIG. 5c, where the second electric polarization field E2 is likewise pulsed with triangular pulses, the second electric polarization field E2 is formed from a constant electric polarization field E2.

The pulse durations of the first and second electric polarization fields E1 and E2 are preferably greater than one millisecond, for example, 10 milliseconds or greater. Furthermore, the pulse durations of the first and second electric polarization fields E1 and E2 are preferably less than 10 minutes, for example, less than or equal to one minute.

Although not explicitly illustrated in part, the electric polarization fields and the field pulses of the first and second electric polarization fields can have one or more of the pulse shapes rectangular, triangular, trapezoidal and sinusoidal shape.

The pulsation of the electric polarization fields E1 and E2 during the polarization gives rise to heat loss which can advantageously improve the effect of the polarization by up to 20% compared to a static or un-pulsed polarization, i.e. the alignment of the polarization of each ferroelectric domain 4 along the electric polarization field respectively applied is advantageously promoted.

Although not explicitly illustrated in the figures, a device for applying the mechanical force to the piezoelectric main body and to the electronic component can be provided in the context of the present application. The invention is not restricted by the description on the basis of the exemplary embodiments. Rather, the invention encompasses any novel feature and also any combination of features, which in particular includes any combination of features in the patent claims, even if this feature or this combination itself is not explicitly indicated in the patent claims or exemplary embodiments.

What is claimed is:

1. A method for producing an electronic component, the method comprising:
   providing a piezoelectric main body that includes a plurality of electrodes;
   applying a first electric polarization field having a first polarity direction to the piezoelectric main body between the electrodes, wherein, after applying the first electric polarization field, a deflection of the piezoelectric main body as a function of the applied electric polarization field follows a hysteresis curve that determines an electric coercive field strength;
   after applying the first electric polarization field, applying a second electric polarization field in a second polarity direction opposite to the first polarity direction to the piezoelectric main body between the electrodes, wherein the absolute value of the second electric polarization field differs from the absolute value of the first electric polarization field, and wherein the absolute value of the second electric polarization field is less than the absolute value of the electric coercive field strength; and
   completing the electronic component.

2. The method according to claim 1, wherein, relative to a predefined electric operating field of the electronic component which is applied for operation between the electrodes, the first polarity direction is positive and the second polarity direction is negative.

3. The method according to claim 1, wherein the absolute value of the first electric polarization field is between 1 and 4 kV/mm.

4. The method according to claim 1, wherein the absolute value of the first electric polarization field is greater than the absolute value of the second electric polarization field.

5. The method according to claim 1, wherein the first or the second electric polarization field has a temporal field profile having one or more electric field pulses.

6. The method according to claim 5, wherein the field pulses of the first or of the second electric polarization field each have a pulse shape selected from the group consisting of a rectangular shape, a triangular shape, a trapezoidal shape and a sinusoidal shape.

7. The method according to claim 1, wherein the first and the second electric polarization field both have a temporal field profile having one or more electric field pulses.

8. The method according to claim 7, wherein the field pulses of the first and second electric polarization fields each have a pulse shape selected from the group consisting of a rectangular shape, a triangular shape, a trapezoidal shape and a sinusoidal shape.

9. The method according to claim 1, wherein the piezoelectric main body has a plurality of piezoelectric layers and is provided with a plurality of internal electrode layers, wherein the plurality of electrodes form external electrodes arranged outside the piezoelectric main body, and wherein each internal electrode layer is electrically conductively connected to one of the external electrodes.

10. The method according to claim 1, wherein the electronic component which was polarized with the first and second electric polarization fields has an achievable deflection during operation that is 60% higher than that of an electronic component which was not polarized with the first and second electric polarization fields and did not have a mechanical force applied thereto.

11. An operating method for an electronic component that was produced according to the method of claim 1, wherein the method comprises applying a mechanical force to the electronic component.

12. The operating method according to claim 11, wherein applying the mechanical force to the electronic component is followed by applying an electric operating field between the electrodes of the electronic component, wherein the electric operating field is polarized in accordance with the first polarity direction.

13. An electronic component which was produced according to the method according claim 1.

14. A method of operating an electronic component that includes a piezoelectric main body that with first and second electrodes, the method comprising:

applying a first electric polarization field having a first polarity direction to the piezoelectric main body between the first and second electrodes, wherein, after applying the first electric polarization field, a deflection of the piezoelectric main body as a function of the applied electric polarization field follows a hysteresis curve that determines an electric coercive field strength; and after applying the first electric polarization field, applying a second electric polarization field in a second polarity direction opposite to the first polarity direction to the piezoelectric main body between the first and second electrodes, wherein the absolute value of the second electric polarization field differs from the absolute value of the first electric polarization field, and wherein the absolute value of the second electric polarization field is less than the absolute value of the electric coercive field strength.

15. The method according to claim 14, further comprising applying a mechanical force to the electronic component.

16. The method according to claim 15, wherein applying the mechanical force to the electronic component is followed by applying the first electric polarization field having a first polarity direction.

* * * * *